(12) United States Patent
Simon

(10) Patent No.: US 6,807,345 B2
(45) Date of Patent: Oct. 19, 2004

(54) SYSTEMS AND METHODS FOR REMOVING HEAT FROM OPTO-ELECTRONIC COMPONENTS

(75) Inventor: Jonathan Simon, Castro Valley, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 233 days.

(21) Appl. No.: 10/156,445

(22) Filed: May 28, 2002

(65) Prior Publication Data

US 2003/0223697 A1 Dec. 4, 2003

(51) Int. Cl.[7] ................................................. G02B 6/30
(52) U.S. Cl. .............................. 385/49; 385/92; 385/94
(58) Field of Search .............................. 385/49, 88–94; 313/512, 499, 503, 501

(56) References Cited

U.S. PATENT DOCUMENTS

| | | | |
|---|---|---|---|
| 5,500,540 A | 3/1996 | Jewell et al. | 257/82 |
| 6,508,595 B1 * | 1/2003 | Chan et al. | 385/92 |
| 6,639,360 B2 * | 10/2003 | Roberts et al. | 313/512 |
| 2001/0031109 A1 | 10/2001 | Paniccla et al. | |

FOREIGN PATENT DOCUMENTS

| | | |
|---|---|---|
| EP | 0 567 287 A1 | 10/1993 |
| EP | 0 653 823 A2 | 5/1995 |
| EP | 0 748 007 A2 | 12/1996 |
| WO | WO 98/32197 | 7/1998 |

* cited by examiner

Primary Examiner—Phan T. H. Palmer

(57) ABSTRACT

Systems for removing heat from an opto-electronic component are provided. One such system incorporates an opto-electronic component that is thermally coupled to a heat spreader. The heat spreader is formed, at least partially, of a material capable of propagating optical signals. The heat spreader is operative to receive heat from the opto-electronic component and conduct an amount of the heat through at least a portion of the heat spreader. Methods and other systems also are provided.

18 Claims, 2 Drawing Sheets

SYSTEMS AND METHODS FOR REMOVING HEAT FROM OPTO-ELECTRONIC COMPONENTS

BACKGROUND OF THE INVENTION

1. Field of the Invention

The present invention generally relates to optics. More specifically, the invention relates to systems and methods for removing heat from opto-electronic components.

2. Description of the Related Art

In an effort to increase the operating speed of opto-electronic components, emphasis has been placed on reducing component size. In particular, it is desirable to decrease the lengths of the optical paths of these components through which optical signals propagate. By reducing the lengths of the optical paths, a corresponding increase in operating speed typically can be achieved.

When reducing the size of opto-electronic components, however, certain problems become evident. By way of example, tight integration can limit the use of optical signal transmission through free space. This is because free space requires line of sight between the components that are to communicate optically with each other and tight integration may render line of sight unavailable. Additionally, small component sizes and large numbers of data channels often make the use of optical fibers impractical because fiber attachment between closely spaced components can be difficult and time consuming.

Removing heat from opto-electronic components also is difficult. This is because the heat fluxes exhibited by the opto-electronic components tend to increase as the size of opto-electronic components is reduced. Typically, conventional techniques for removing heat from such opto-electronic components are inadequate.

Failure to remove heat adequately from an opto-electronic component can cause the component to form point heat-loads in a substrate that supports the component. This can result in structural failure of the substrate. Additionally, the opto-electronic component can develop point heat-loads that can cause operational failure of the opto-electronic component. Therefore, it should be understood that there is a need for improved systems and methods that address these and/or other perceived shortcomings of the prior art.

SUMMARY OF THE INVENTION

Systems and methods in accordance with the present invention reduce the ability of opto-electronic components to develop point heat-loads and/or form point heat-loads in substrates which are used to support the opto-electronic components. This is accomplished by thermally coupling a heat spreader to an opto-electronic component. Such a heat spreader is formed of a material that exhibits a thermal conductivity greater than most metals. Because of this, heat can be efficiently removed from the opto-electronic component via the heat spreader.

Additionally, some heat spreaders propagate optical signals associated with the opto-electric components to which the heat spreaders are thermally coupled. For instance, a heat spreader can be formed of diamond, such as a thick film diamond substrate, that can be used to propagate optical signals.

Clearly, some embodiments of the invention may not exhibit one or more of the advantages and/or properties set forth above. Additionally, other systems, methods, features and/or advantages of the present invention will be or may become apparent to one with skill in the art upon examination of the following drawings and detailed description. It is intended that all such additional systems, methods, features and/or advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

As will be described in greater detail here, systems and methods in accordance with the present invention involve the use of opto-electronic components. In particular, these opto-electronic components are thermally coupled to heat spreaders that remove heat from the opto-electronic components so that a tendency of the opto-electronic components to develop and/or form point heat-loads is reduced.

Figure 1:
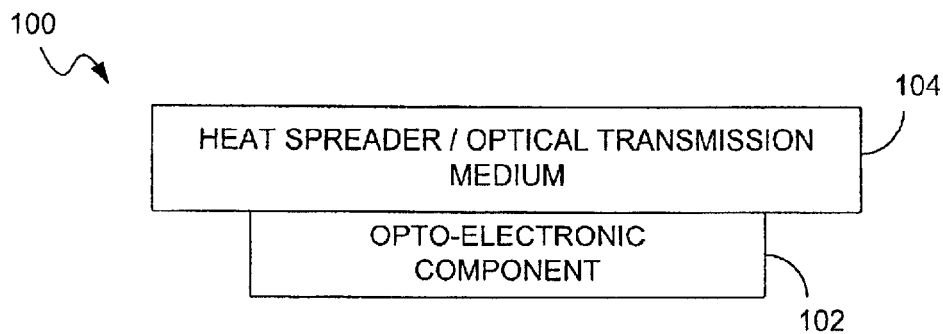
FIG. 1 is a schematic diagram of an embodiment of an opto-electronic system in accordance with the present invention.

Referring now to the figures, wherein like reference numerals designate corresponding parts throughout the several views, FIG. 1 schematically depicts an embodiment of an opto-electronic system 100 of the present invention. As shown in FIG. 1, opto-electronic system 100 includes an opto-electronic component 102 and a heat spreader 104. More specifically, heat spreader 104 is thermally coupled to opto-electronic component 102. Note, opto-electronic component 102 can be provided in various configurations, such as a circuit assembly, that use both electrical and optical signals.

Heat spreader 104 removes heat from the opto-electronic component 102. In particular, heat spreader 104 is formed, at least partially, of a non-metal material that exhibits a thermal conductivity greater than most metals. By way of example, diamond, e.g., a thick film diamond substrate, can be used. Since the thermal conductivity of the material of the heat spreader is high, heat can spread from the opto-electronic component and throughout the heat spreader. This reduces the potential of the opto-electronic component to develop point heat-loads, as well as the tendency of the opto-electronic component to form point heat-loads in components that are thermally coupled to the opto-electronic component.

Note, heat spreader 104 of FIG. 1 also is capable of propagating optical signals. In particular, at least a portion of the heat spreader is optically transparent and, therefore, can be used to propagate optical signals to and/or from the opto-electronic component. Additionally or alternatively, heat spreader 104 can be used to propagate optical signals that are not directly associated with opto-electronic component 102. That is, the heat spreader could be used as a transmission medium for propagating optical signals between components (not shown) other than opto-electronic component 102.

Figure 2:
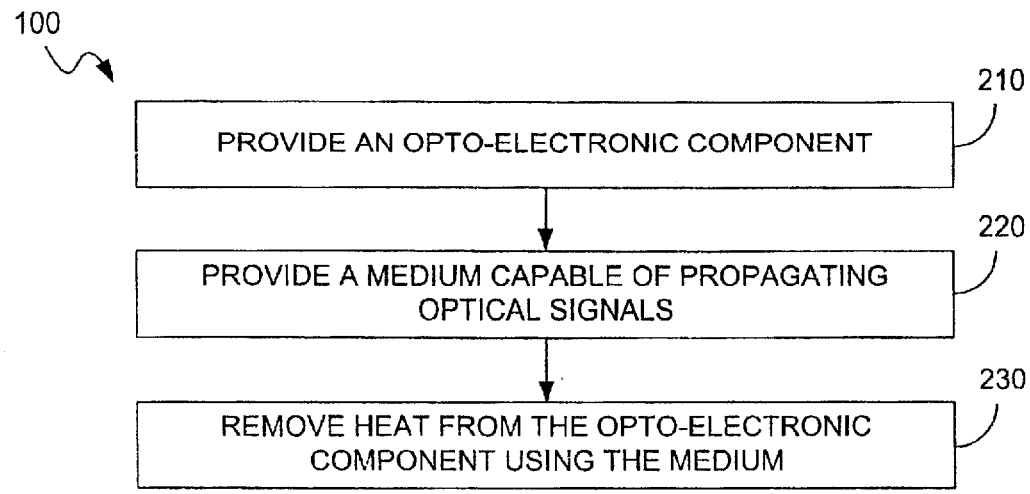
FIG. 2 is a flowchart depicting functionality of the opto-electronic system of FIG. 1.

Functionality of the embodiment of the opto-electronic system 10 of FIG. 1 will now be described with reference to the flowchart of FIG. 2. As shown in FIG. 2, an opto-electronic component is provided (block 210). In block 220, a medium capable of propagating optical signals is provided. Thereafter, in block 230, heat is removed from the opto-electronic component using the medium. This is accomplished by thermally coupling the medium, which forms at least a portion of a heat spreader, to the opto-electronic component.

Figure 3:
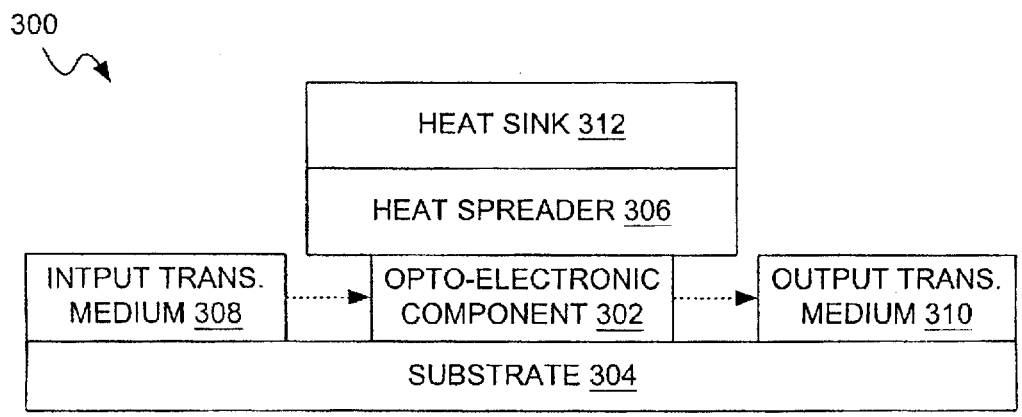
FIG. 3 is a schematic diagram of another embodiment of an opto-electronic system in accordance with the present invention.

Another embodiment of an opto-electronic system in accordance with the invention is depicted schematically in FIG. 3. As shown in FIG. 3, opto-electronic system 300 includes an opto-electronic component 302 that is supported by a substrate 304. A heat spreader 306 is thermally coupled to the opto-electronic component and is used to remove heat from the opto-electronic component.

Note, heat spreader 306 exhibits an exterior surface area that is greater than the exterior surface area of opto-electronic component 302. In other embodiments, however, the exterior surface area of the heat spreader could be equal to or less than the exterior surface area of the opto-electronic component.

FIG. 3 also depicts an input transmission medium 308 and an output transmission medium 310 that are used to propagate optical signals to and from opto-electronic component 302. Clearly, some embodiments may not require the use of either or both of the transmission media depicted in FIG. 3, while other embodiments may require additional transmission media. In other embodiments, the transmission media could be and/or could include electrical transmission media.

Also depicted in FIG. 3 is a heat sink 312. Heat sink 312 is thermally coupled to heat spreader 306, which is thermally coupled to opto-electronic component 302. Thus, an amount of heat transferred from the opto-electronic component to the heat spreader is transferred to the heat sink. Typically, heat sink 314 exhibits an exterior surface area that is greater than the exterior surface area of heat spreader 306. In other embodiments, however, the exterior surface area of the heat spreader could be equal to or less than the exterior surface area of the heat spreader and/or the exterior surface area of the opto-electronic component.

Heat sink 312 can be formed of various materials and in various configurations for dissipating heat provided from the heat spreader and/or opto-electronic component. By way of example, the heat sink could be formed of metal, such as copper or aluminum. Such a heat sink also could incorporate pins and/or fins for increasing the exterior surface area of the heat sink.

Figure 4:
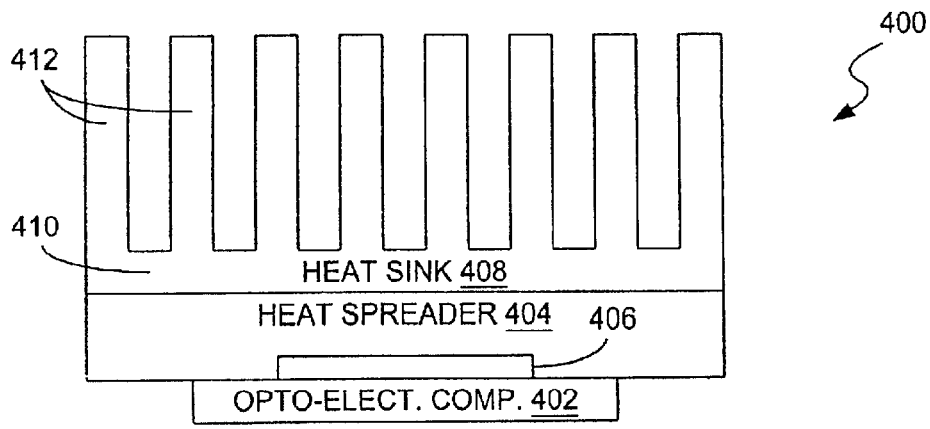
FIG. 4 is a schematic diagram of another embodiment of the opto-electronic system in accordance with the present invention.

Another embodiment of an opto-electronic system in accordance with the invention that incorporates a heat sink is depicted schematically in FIG. 4. As shown in FIG. 4, opto-electronic system 400 includes an opto-electronic component 402 and a heat spreader 404 that is thermally coupled to the opto-electronic component.

The heat spreader also includes at least one waveguide, e.g., waveguide 406, that is used to propagate optical signals to and/or from the opto-electronic component. Thus, the heat spreader is able to remove heat from the opto-electronic component as well as facilitate propagation of optical signals to and/or from the opto-electronic component. Typically, such a waveguide is formed by an etching process, although various other techniques can be used. For example, selective doping with hydrogen or metal ions can be used to alter the refractive index of the material to form a waveguide.

A heat sink 408 is thermally coupled to heat spreader 406. In FIG. 4, heat sink 408 includes a base 410 that abuts the heat spreader and multiple fins 412 that extend outwardly from the base. The fins increase the exterior surface area of the heat sink so that heat can be dissipated, such as by thermal conduction, to media surrounding the heat sink.

Advantageously, use of the heat spreader distributes heat from the opto-electronic component more uniformly to the base of the heat sink than would otherwise typically be achieved if the heat sink were directly thermally coupled to the opto-electronic component. This enables the heat sink to dissipate heat more efficiently and, therefore, should reduce the tendency of the opto-electronic component to develop point heat-loads and/or form point heat-loads in components that are thermally coupled thereto.

Figure 5:
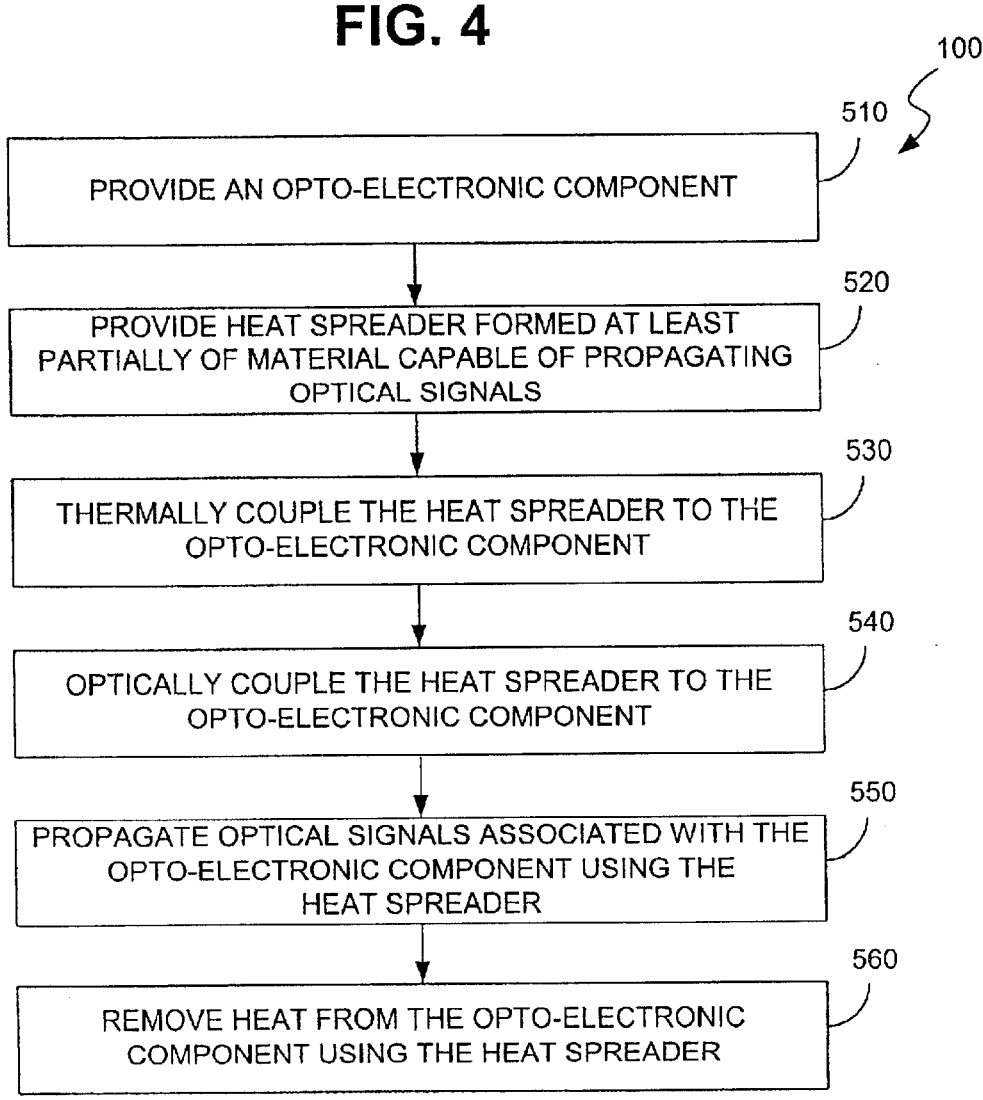
FIG. 5 is a flowchart depicting functionality of the opto-electronic system of FIG. 4.

Functionality of the embodiment of opto-electronic system 400 of FIG. 4 will now be described with reference to the flowchart of FIG. 5. As shown in FIG. 5, an opto-electronic component is provided in block 510. In block 520, a heat spreader formed, at least partially, of a material capable of propagating optical signals is provided. The opto-electronic component and the heat spreader then are thermally and optically coupled to each other (blocks 530 and 540). In block 550, optical signals associated with the opto-electronic component are propagated by the heat spreader. In block 560, the heat spreader is used to remove heat from the opto-electronic component.

The foregoing description has been presented for purposes of illustration and description. It is not intended to be exhaustive or to limit the invention to the precise forms disclosed. Modifications and/or variations are possible in light of the above teachings. The embodiments discussed, however, were chosen and described to provide illustration of the principles of the invention and its practical application to thereby enable one of ordinary skill in the art to utilize the invention in various embodiments and with various modifications as are suited to the particular use contemplated.

By way of example, although embodiments of the heat spreader described above are formed of diamond, which is optically transparent, various other materials can be used. For instance, graphite and carbon fiber/epoxy composites can be used. Clearly, graphite is not optically transparent and, thus, optical signals are propagated through channels formed through the graphite of such heat spreaders. Additionally, carbon fiber/epoxy composites can include portions that are optically transparent. All such modifications and variations are within the scope of the invention as determined by the appended claims when interpreted in accordance with the breadth to which they are fairly and legally entitled.

What is claimed is:

1. An opto-electronic system comprising:
   an opto-electronic component; and
   a heat spreader thermally coupled to the opto-electronic component, the heat spreader being formed, at least partially, of a material capable of propagating optical signals, the heat spreader being operative to receive heat from the opto-electronic component and conduct an amount of the heat through at least a portion of the heat spreader, and wherein the heat spreader includes an optical waveguide, the optical waveguide optically communicating with the opto-electronic component.

2. The system of claim 1, wherein the heat spreader is formed, at least partially, of a thick film diamond substrate; and wherein the optical waveguide is formed in the thick film diamond substrate.

3. The system of claim 1, wherein the heat spreader is formed, at least partially, of diamond.

4. An opto-electronic system comprising:

an opto-electronic component;

a heat spreader thermally coupled to the opto-electronic component, at least a portion of the heat spreader being optically transparent such that optical signals can be propagated through the optically transparent portion, the heat spreader being operative to receive heat from the opto-electronic component and conduct an amount of the heat through at least a portion of the heat spreader, and wherein the heat spreader defines a an optical waveguide, the waveguide being optically coupled to the opto-electronic component and being operative to propagate optical signals associated with the opto-electronic component.

5. The system of claim 4, further comprising:

a heat sink thermally coupled to the heat spreader, the heat sink having an exterior surface area greater than an exterior surface area of the opto-electronic component, the heat sink being operative to receive heat from the opto-electronic component via the heat spreader.

6. The system of claim 5, wherein the exterior surface area of the heat sink is greater than an exterior surface area of the heat spreader.

7. The system of claim 5, wherein the heat sink is formed, at least partially, of metal.

8. The system of claim 4, further comprising:

a heat sink thermally coupled to the heat spreader such that the heat spreader is arranged at least partially between the opto-electronic component and the heat sink, the heat sink having an exterior surface area greater than an exterior surface area of the heat spreader, the heat sink being operative to receive heat associated with the opto-electronic component via the heat spreader.

9. The system of claim 8, wherein the heat sink is formed of metal.

10. The system of claim 4, further comprising:

means for propagating optical signals associated with the opto-electronic component.

11. The system of claim 4, wherein the heat spreader is at least partially formed of at least one of diamond, graphite and carbon fiber/epoxy composite.

12. The system of claim 4, further comprising:

an input transmission medium, the input transmission medium being at least one of optically and electrically coupled to the opto-electronic component.

13. The system of claim 4, further comprising:

an output transmission medium, the output transmission medium being at least one of optically and electrically coupled to the opto-electronic component.

14. The system of claim 4, wherein the heat spreader is formed, at least partially, of a thick film diamond substrate.

15. A method for removing heat from an opto-electronic component, the method comprising:

providing an opto-electronic component;

providing a medium including an optical waveguide capable of propagating optical signals; and removing heat from the opto-electronic component with the medium.

16. The method of claim 15, further comprising:

providing a heat sink; and thermally coupling the heat sink to the medium such that an amount of heat removed from the opto-electronic component by the medium is transferred to the heat sink.

17. The method of claim 15, further comprising:

providing signals to the opto-electronic component; and receiving signals from the opto-electronic component.

18. The method of claim 15, further comprising:

optically coupling at least a portion of the medium to the opto-electronic component; and propagating optical signals associated with the opto-electronic component via the portion of the medium.

* * * * *